(12) United States Patent
Wang et al.

(10) Patent No.: US 11,430,768 B2
(45) Date of Patent: Aug. 30, 2022

(54) STACKED DIE CHIP PACKAGE STRUCTURE AND METHOD OF MANUFACTURING THE SAME

(71) Applicant: Unimicron Technology Corp., Taoyuan (TW)

(72) Inventors: Tzu-Hsuan Wang, Taoyuan (TW); Chen-Hsien Liu, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/182,258

(22) Filed: Feb. 23, 2021

(65) Prior Publication Data

US 2022/0189923 A1 Jun. 16, 2022

(30) Foreign Application Priority Data

Dec. 11, 2020 (TW) .................................. 109143896

(51) Int. Cl.
*H01L 25/065* (2006.01)
*H01L 25/00* (2006.01)
(Continued)

(52) U.S. Cl.
CPC ........ *H01L 25/0657* (2013.01); *H01L 21/565* (2013.01); *H01L 21/76898* (2013.01);
(Continued)

(58) Field of Classification Search
CPC .............. H01L 25/0657; H01L 21/565; H01L 21/76898; H01L 23/4334; H01L 23/481; H01L 25/50; H01L 23/49822; H01L 24/13; H01L 24/16; H01L 24/17; H01L 2224/13025; H01L 2224/16146; H01L 2224/16227; H01L 2224/17181;
(Continued)

(56) References Cited

U.S. PATENT DOCUMENTS

2013/0277821 A1\* 10/2013 Lundberg ................ H01L 23/36
257/713
2015/0214208 A1\* 7/2015 Stephens ............. H01L 21/3212
438/109

(Continued)

FOREIGN PATENT DOCUMENTS

KR     101450761 B1   10/2014
TW     201503315 A     1/2015
(Continued)

*Primary Examiner* — Mamadou L Diallo
(74) *Attorney, Agent, or Firm* — CKC & Partners Co., LLC

(57) ABSTRACT

A chip package structure includes a wiring board, a first chip, a second chip, a thermally conductive material, a molding compound and a heat dissipation part. The wiring board includes a plurality of circuit pads. The first chip is mounted on the wiring board and is electrically connected to at least one of the circuit pads. The first chip is located between the second chip and the wiring board. The thermally conductive material is located on the wiring board and penetrates the second chip and the first chip to extend to the wiring board. The molding compound is disposed on the wiring board, and the heat dissipation part is disposed on the molding material and thermally coupled to the thermally conductive material.

19 Claims, 14 Drawing Sheets

(51) Int. Cl.
*H01L 23/433* (2006.01)
*H01L 21/56* (2006.01)
*H01L 21/768* (2006.01)
*H01L 23/48* (2006.01)
*H01L 23/498* (2006.01)
*H01L 23/00* (2006.01)

(52) U.S. Cl.
CPC ........ *H01L 23/4334* (2013.01); *H01L 23/481* (2013.01); *H01L 25/50* (2013.01); *H01L 23/49822* (2013.01); *H01L 24/13* (2013.01); *H01L 24/16* (2013.01); *H01L 24/17* (2013.01); *H01L 2224/13025* (2013.01); *H01L 2224/16146* (2013.01); *H01L 2224/16227* (2013.01); *H01L 2224/17181* (2013.01); *H01L 2225/06513* (2013.01); *H01L 2225/06517* (2013.01); *H01L 2225/06524* (2013.01); *H01L 2225/06544* (2013.01); *H01L 2225/06568* (2013.01); *H01L 2225/06589* (2013.01)

(58) Field of Classification Search
CPC . H01L 2225/06513; H01L 2225/06517; H01L 2225/06524; H01L 2225/06544; H01L 2225/06568; H01L 2225/06589
See application file for complete search history.

(56) References Cited

U.S. PATENT DOCUMENTS

| | | | |
|---|---|---|---|
| 2016/0035648 A1* | 2/2016 | Zhou | H01L 25/0657 257/713 |
| 2018/0261528 A1 | 9/2018 | Chen et al. | |
| 2020/0006194 A1* | 1/2020 | Huang | H01L 23/42 |
| 2021/0249324 A1* | 8/2021 | Wan | H01L 23/367 |
| 2021/0257277 A1* | 8/2021 | Bertrand | H01L 23/3677 |

FOREIGN PATENT DOCUMENTS

| | | |
|---|---|---|
| TW | I626719 B | 6/2018 |
| WO | 2020/184027 A1 | 9/2020 |

* cited by examiner

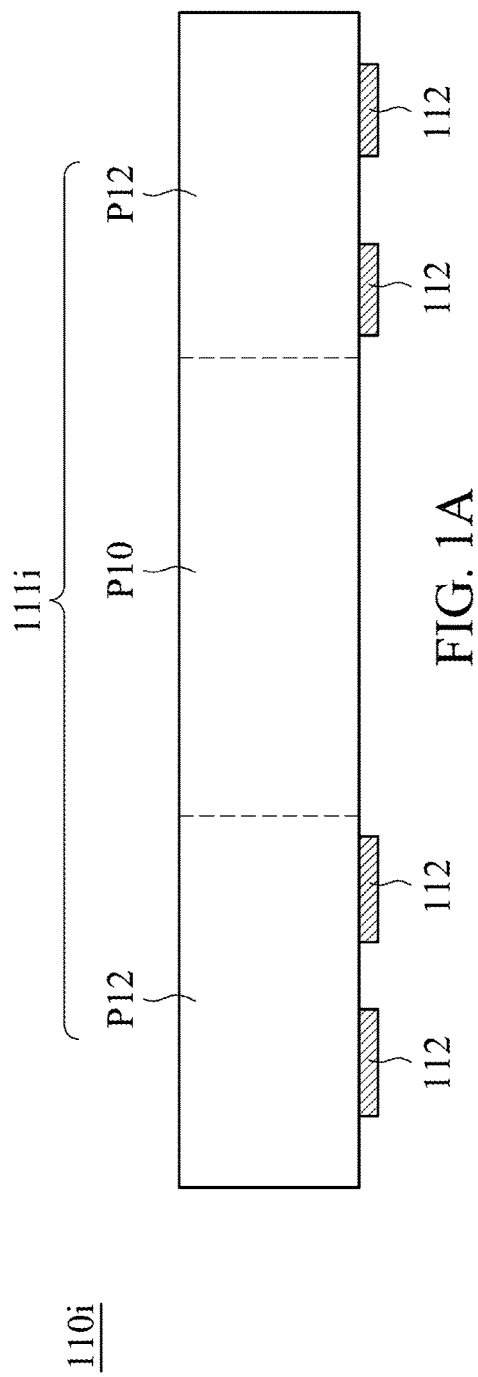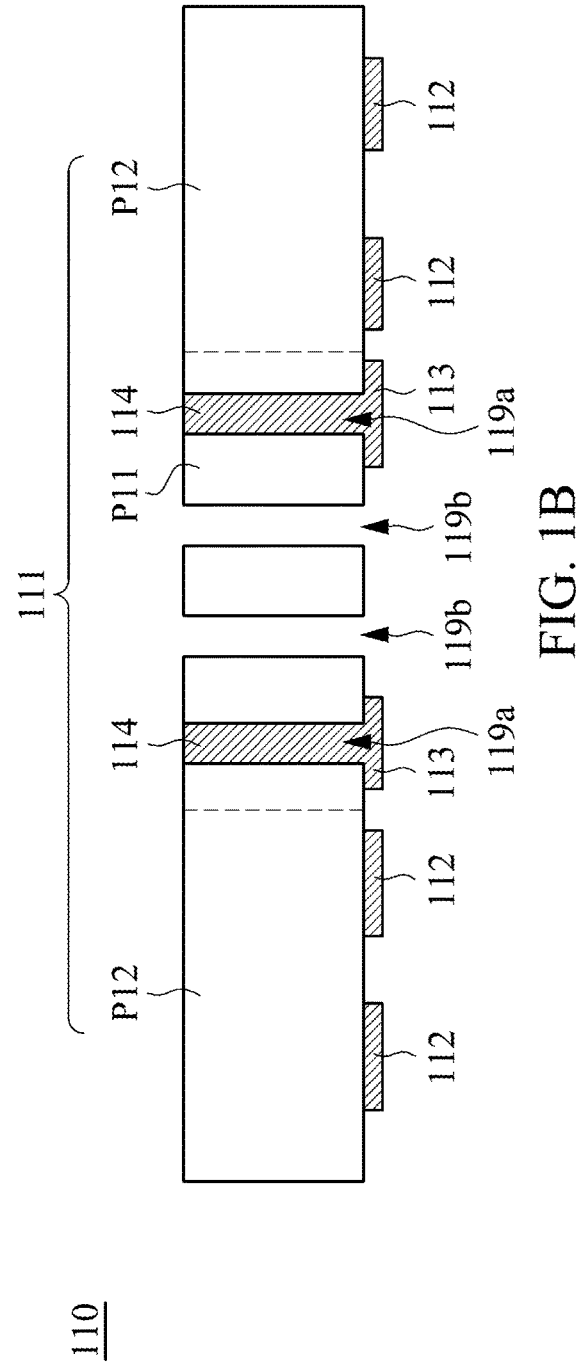

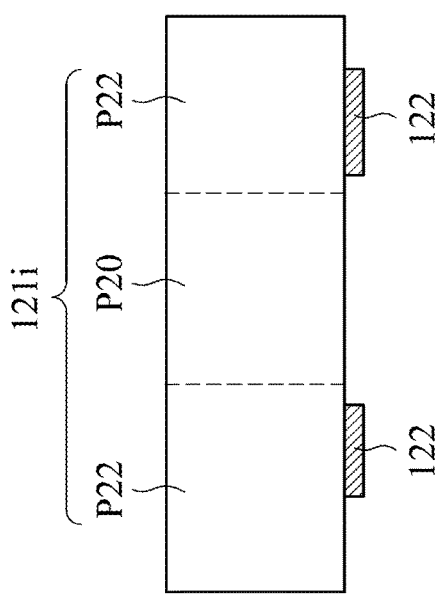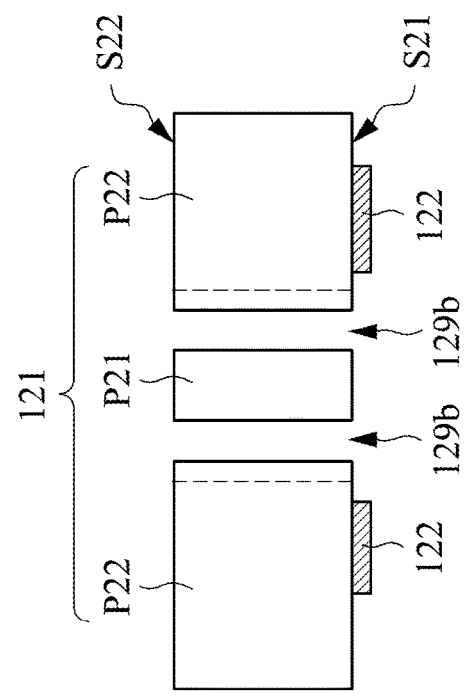

STACKED DIE CHIP PACKAGE STRUCTURE AND METHOD OF MANUFACTURING THE SAME

CROSS-REFERENCE TO RELATED APPLICATION

This application claims priority to Taiwan Application Serial Number 109143896, filed Dec. 11, 2020, which is herein incorporated by reference in its entirety.

BACKGROUND

Field of Invention

The present disclosure relates to a chip package structure and method of manufacturing the same. More particularly, the present disclosure relates to a stacked die package structure and method of manufacturing the same.

Description of Related Art

The conventional semiconductor packaging technology has been developed a stacked chip package structure, and the stacked chip package structure includes a plurality of chips in a stack and a molding compound covering the chips, where the chips are usually encapsulated by the molding compound. However, the thermal conductivity of a common molding compound is low, so that the heat generated by the chips in a stack is difficult to dissipate from the molding compound. Hence, the heat is easy to accumulate in the chips, thereby reducing the efficacy of the chips.

SUMMARY

At least one embodiment of the disclosure provides a chip package structure including a thermally conductive material, in which the thermally conductive material can help to dissipate the heat generated by at least two chips.

Another embodiment of the disclosure provides a method of manufacturing the abovementioned chip package structure.

A chip package structure according to at least one embodiment of the disclosure includes a wiring board, a first chip, a second chip, a thermally conductive material, a molding compound and a heat dissipation part. The wiring board includes a main part and a plurality of circuit pads. The main part has a mounting surface, in which the circuit pads are located on the mounting surface. The first chip is mounted on the mounting surface and electrically connected to at least one of the circuit pads. The second chip is stacked on the first chip, in which the first chip is located between the second chip and the wiring board. The second chip has a first surface and a second surface opposite to the first surface. The thermally conductive material is located on the wiring board and passes through both the second chip and the first chip, in which the thermally conductive material passing through the second chip and the first chip in sequence from the second surface of the second chip extends to the wiring board. The molding compound is disposed on the mounting surface, and covers the first chip and the mounting surface, in which the molding compound surrounds the second chip. The heat dissipation part is disposed on the molding compound and thermally coupled to the thermally conductive material, in which the molding compound is located between the heat dissipation part and the wiring board.

A method of manufacturing a chip package structure according to at least one embodiment of the disclosure includes mounting a first chip and a second chip on a wiring board, in which the first chip is located between the second chip and the wiring board. The first chip has at least one first through hole, and the second chip has at least one second through hole. A thermally conductive material fills both the first through hole and the second through hole. A molding compound is formed on the wiring board, in which the molding compound covers the first chip and the wiring board, and surrounds the second chip. A heat dissipation part is formed on the molding compound, in which the heat dissipation part is thermally coupled to thermally conductive material.

Based on the above, since the thermally conductive material can pass through multiple chips (e.g., the second chip and the first chip), the thermally conductive material can transfer the heat generated by the chips to the heat dissipation part, so that the heat generated by the chips can be transferred to the heat dissipation part quickly to help dissipate the heat for the chips.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows:

FIGS. 1A to 1J are schematic cross-sectional views of a method of manufacturing a chip package structure according to at least one embodiment of the disclosure.

DETAILED DESCRIPTION

Figure 1E:
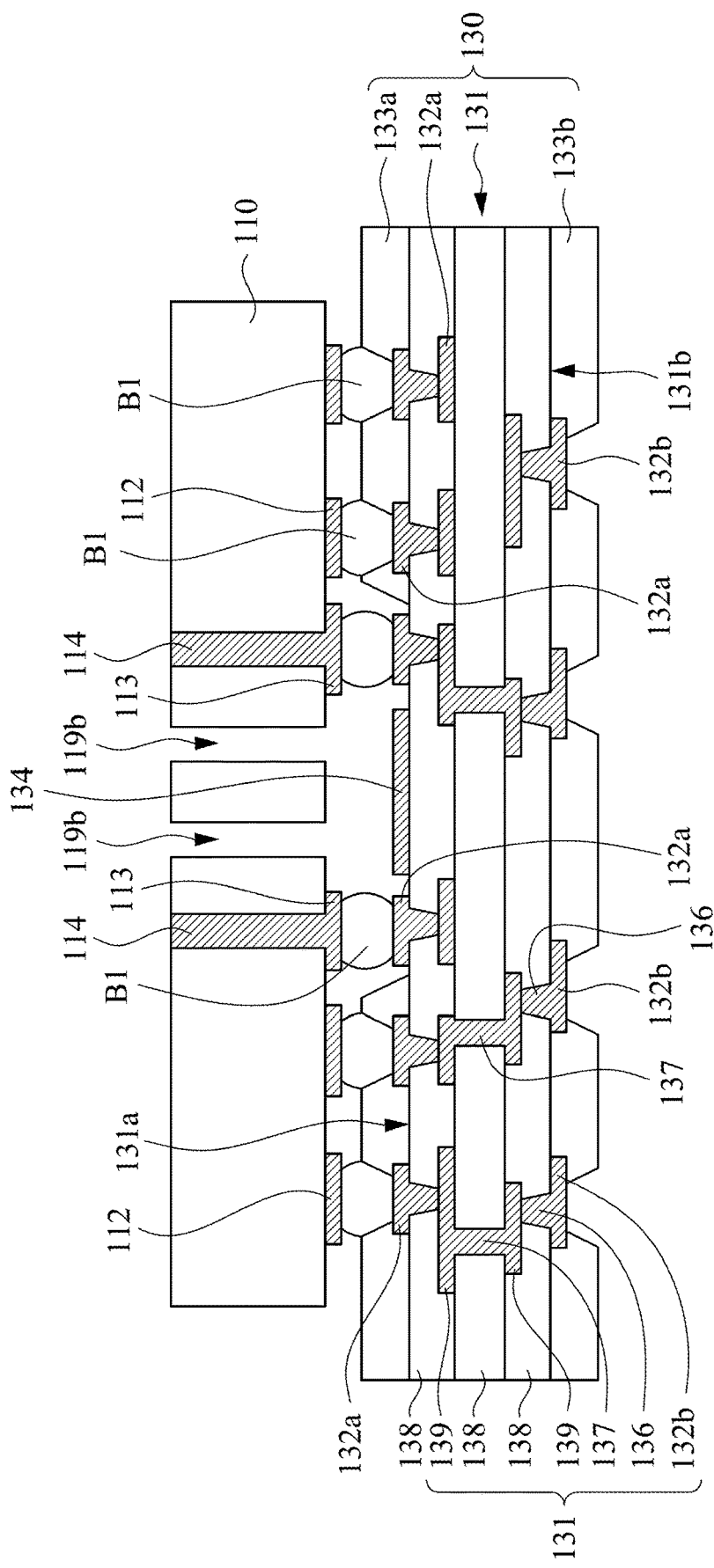

Reference will now be made in detail to the present embodiments of the invention, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unequal proportions. Therefore, the description and explanation of the following embodiments are not limited to the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of patent applications in this case.

Secondly, the words "about", "approximately", or "substantially" appearing in the content of the present disclosure not only cover the clearly stated values and range of values, but also include those with ordinary knowledge in the technical field to which the invention belongs. The allowable deviation range, which can be determined by the error generated during the measurement, and the error is caused by the limitation of the measurement system or the process conditions, for example. In addition, "about" may be expressed within one or more standard deviations of the above values, such as within ±30%, ±20%, ±10%, or ±5%. The words "about", "approximately" or "substantially" appearing in this text can choose acceptable deviation range or standard deviation according to optical properties, etching properties, mechanical properties or other properties, not just one Standard deviation to apply all the above optical properties, etching properties, mechanical properties and other properties.

Figure 1F:
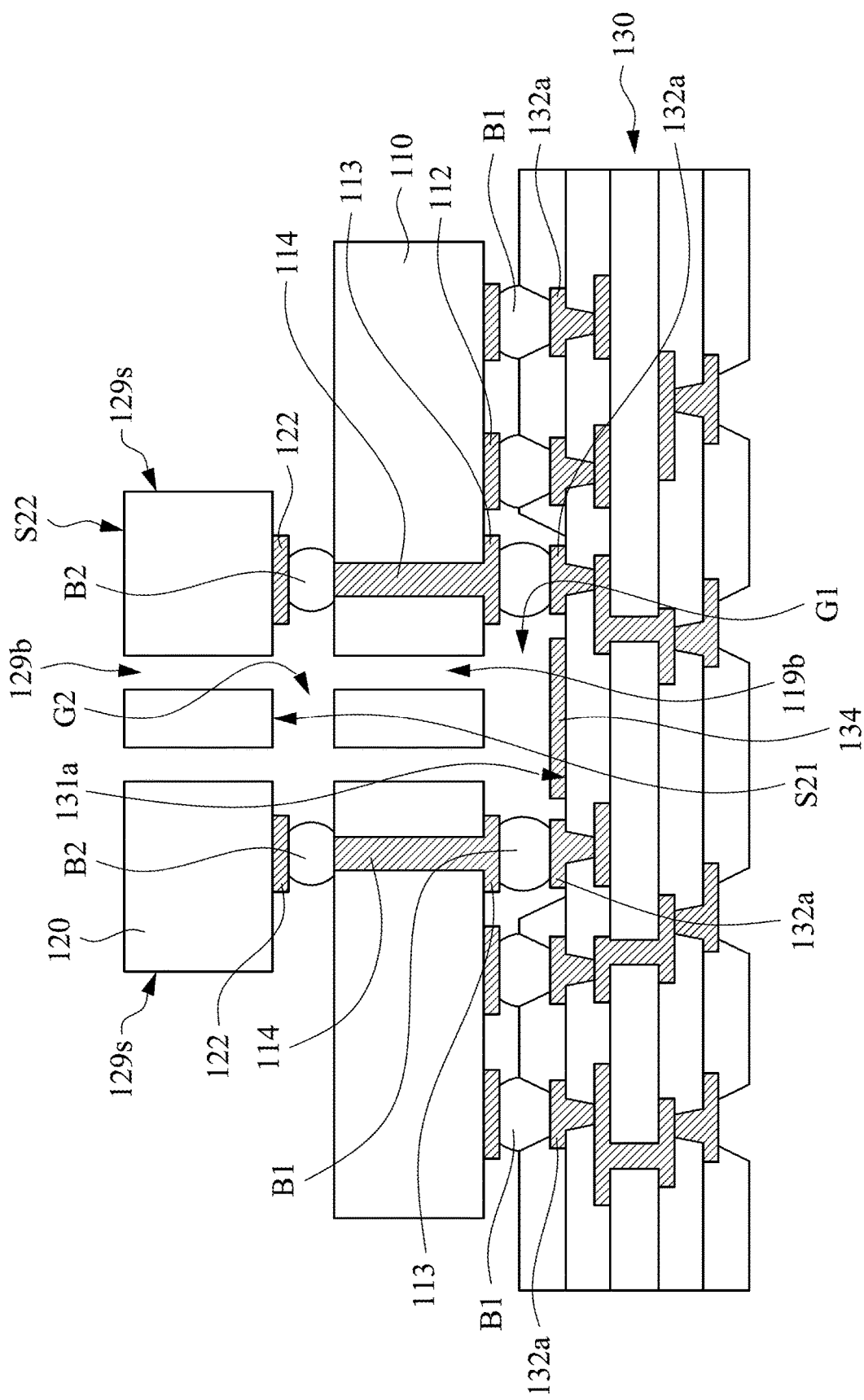
Figure 1G:
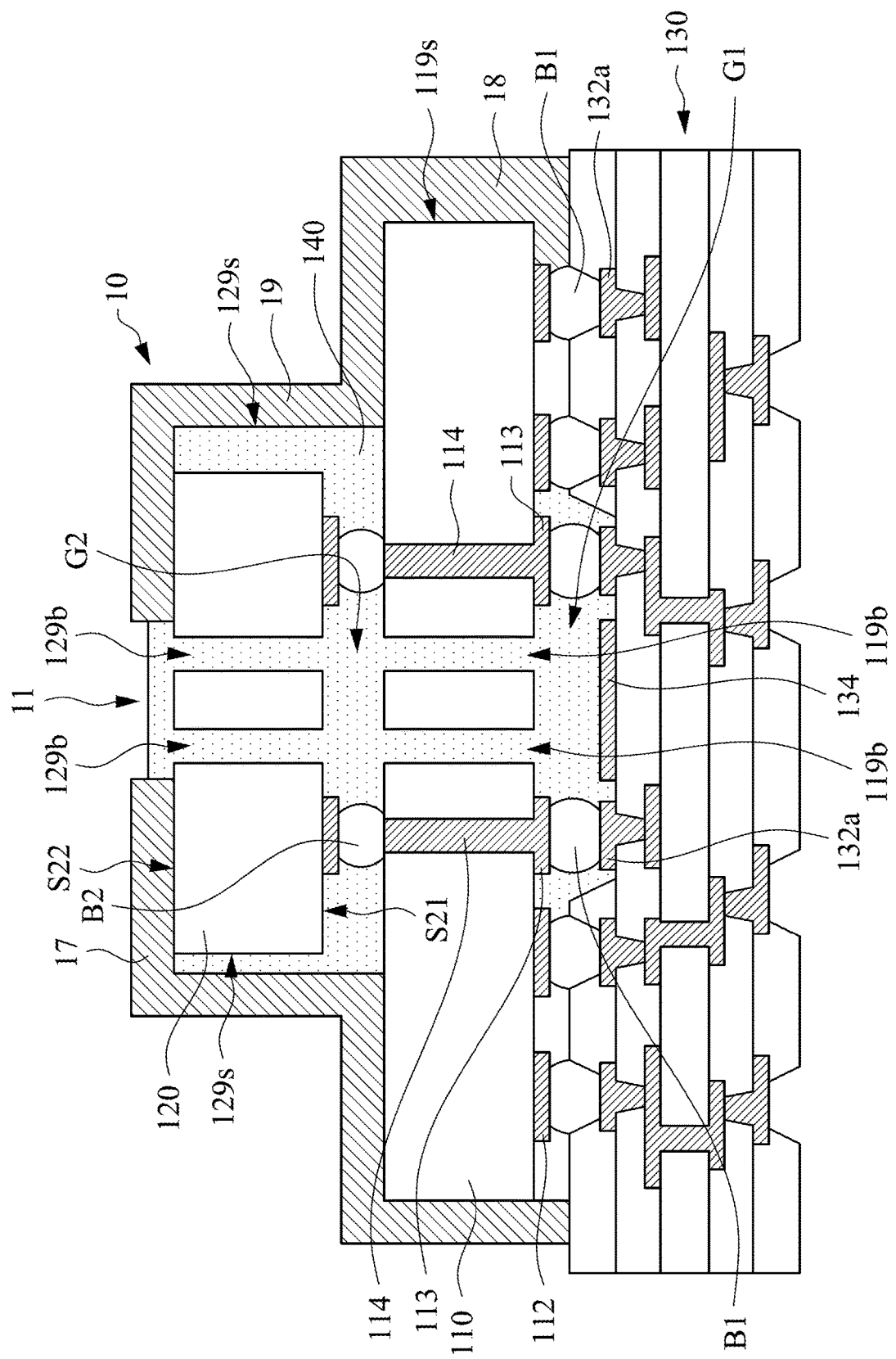
Figure 1H:
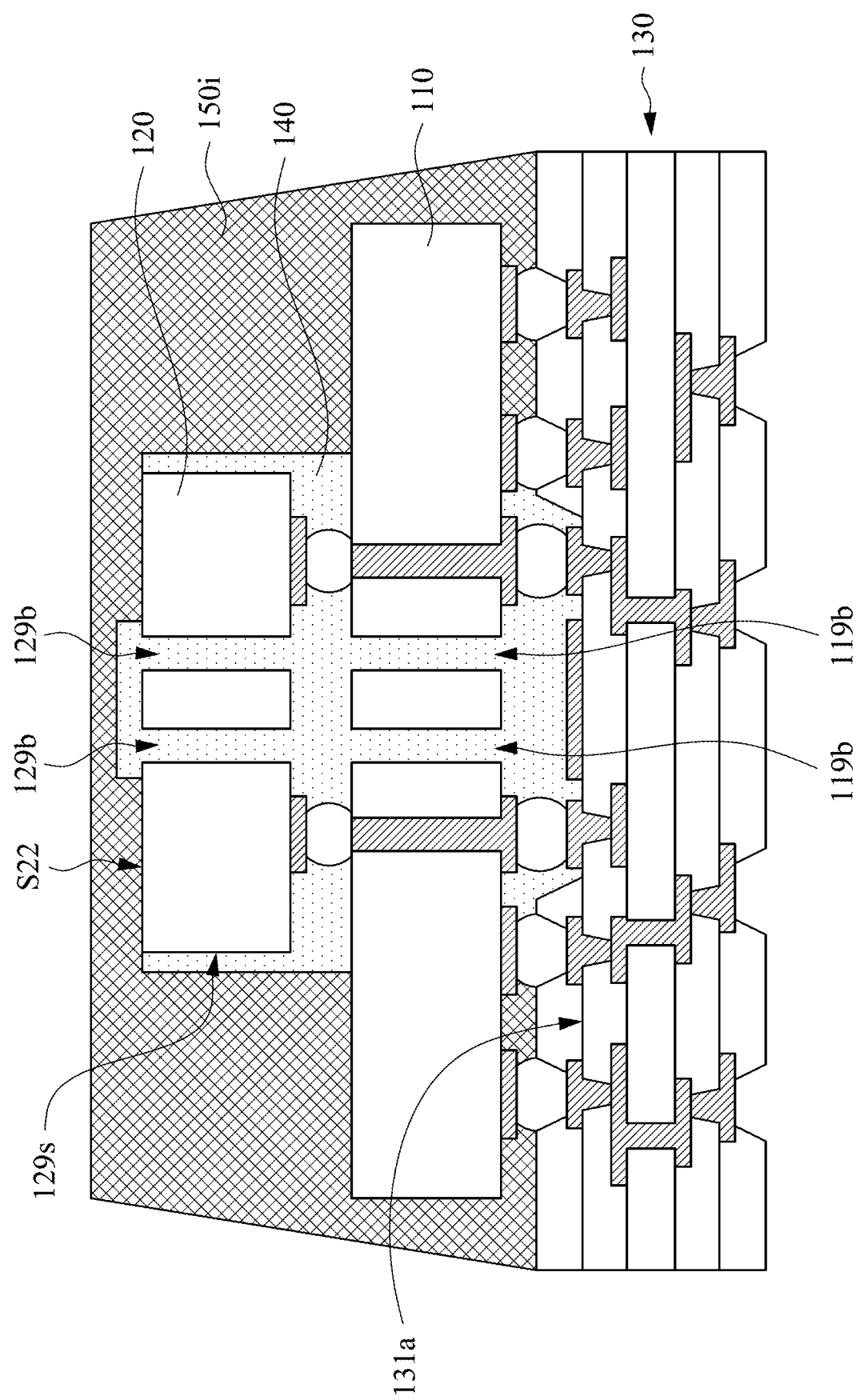
Figure 1I:
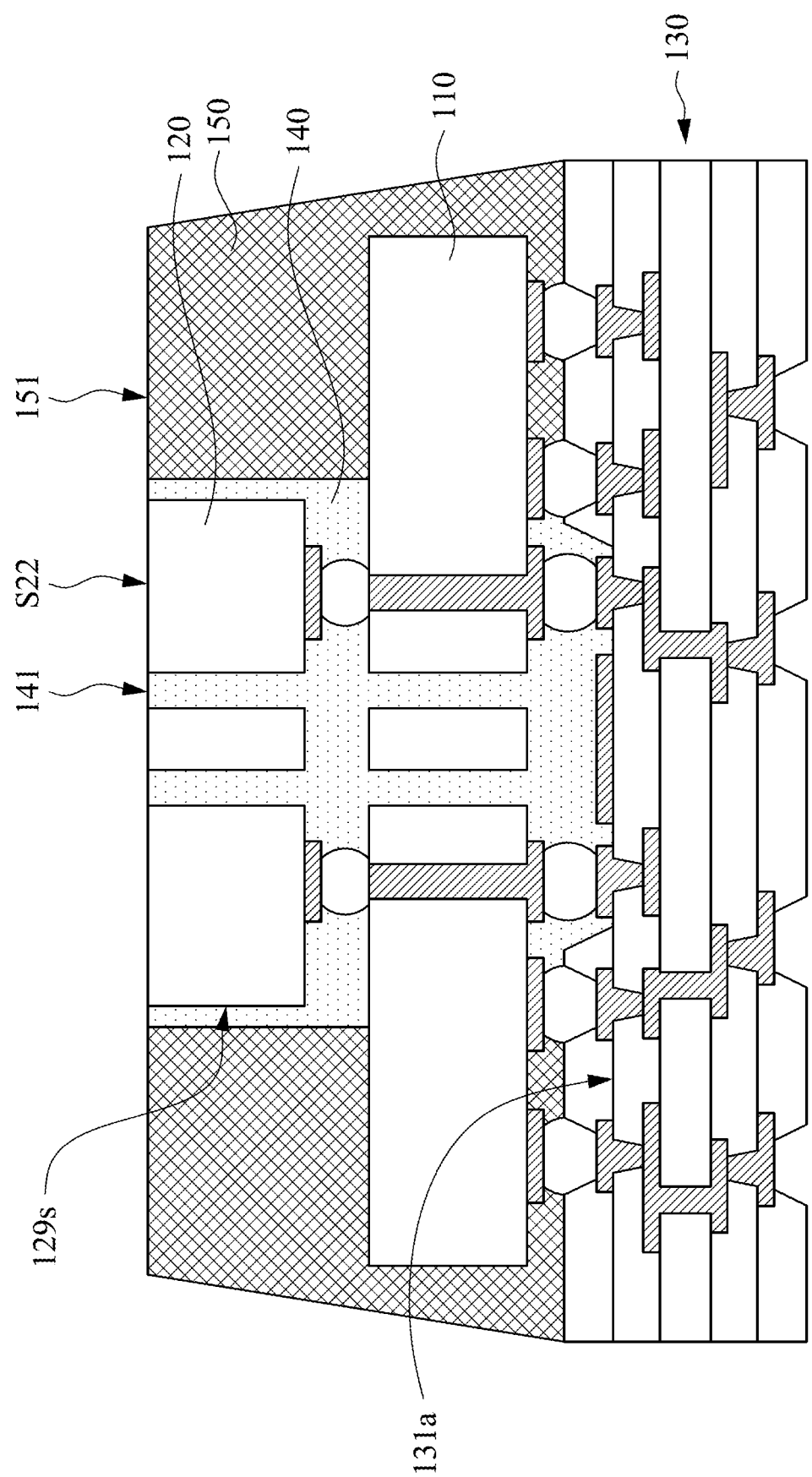
Figure 1J:
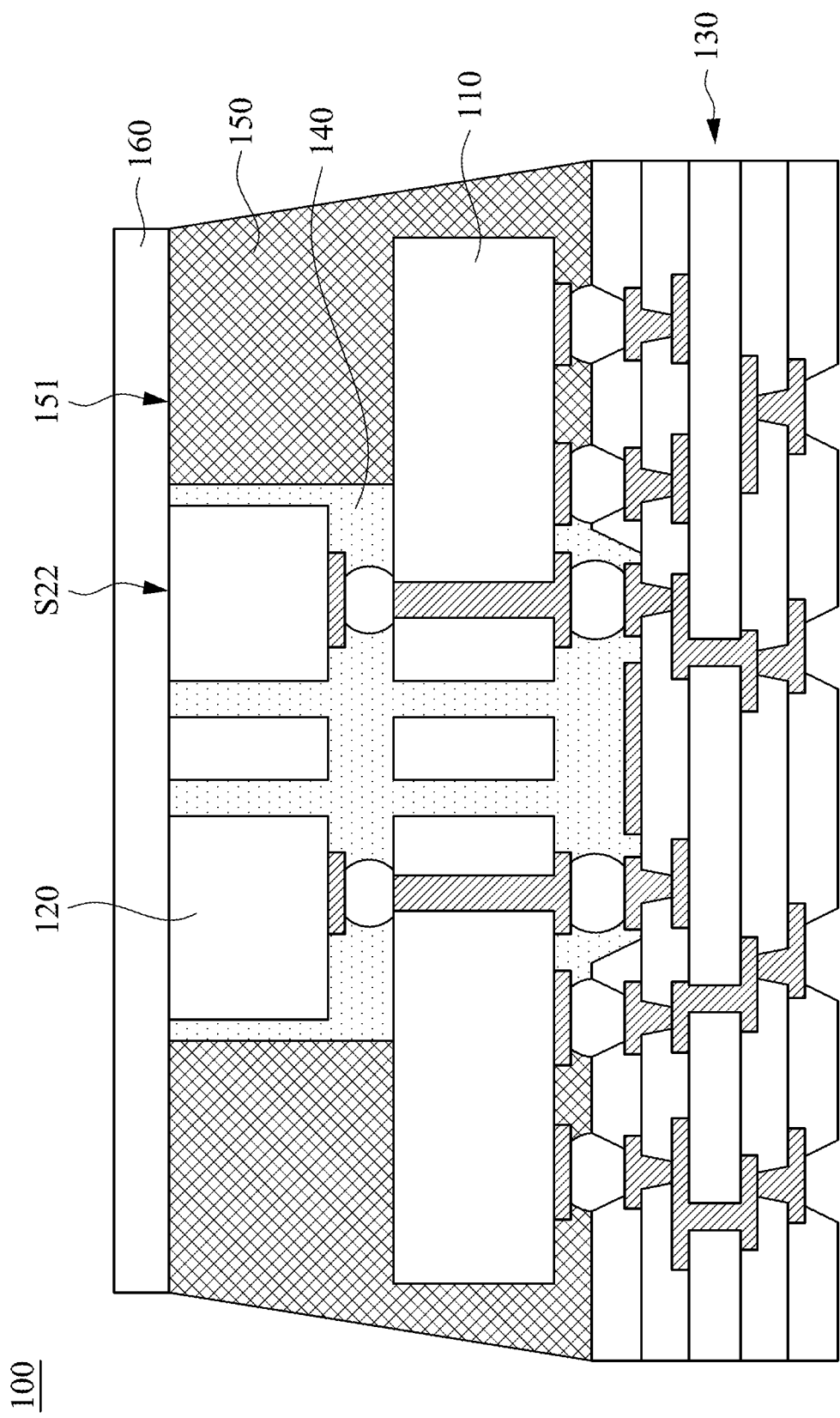

FIGS. 1A to 1J are schematic cross-sectional views of a method of manufacturing a chip package structure according to at least one embodiment of the disclosure, in which FIG. 1J shows a chip package structure 100 which is substantially complete. Referring to FIG. 1A, in the method of manufacturing a chip package structure according to the present embodiment, first, a first chip 110$i$ is provided, where the first chip 110$i$ includes a chip body 111$i$ and a plurality of circuit pads 112, and the circuit pads 112 are located on one of the surfaces of the chip body 111$i$. Taking FIG. 1A for example, all of the circuit pads 112 are located on the lower surface of the chip body 111$i$.

In the embodiment, the first chip 110$i$ may be a die, which is an unpackaged chip. Hence, the main material of the chip body 111$i$ can be semiconductor material, such as silicon or gallium arsenide (GaAs). However, in other embodiment, the first chip 110$i$ may be a packaged chip, so that the first chip 110$i$ is not limited to a die that is unpackaged. The chip body 111$i$ has a non-functional section P10 and a functional section P12, where the functional section P12 is adjacent to the non-functional section P10. There is the circuitry of the first chip 110$i$ in the functional section P12, whereas there may be no circuitry in the non-functional section P10.

Referring to FIG. 1B, next, at least one conductive pillar 114 is formed. In the embodiment as shown in FIG. 1B, a plurality of conductive pillars 114 can be formed, but there may be only one conductive pillar 114 formed in other embodiment. Accordingly, FIG. 1B is for illustration only, and does not limit the quantity of the conductive pillar 114. Referring to FIGS. 1A and 1B, in the embodiment, forming the conductive pillar 114 may include the following steps.

First, a drilling process is performed to the non-functional section P10 of the first chip 110$i$, so as to form a first chip 110 having at least one through hole 119$a$, in which FIG. 1B is illustrated with a plurality of through holes 119$a$, for example. Since the quantity of the conductive pillar 114 formed may be only one, the first chip 110 may have only one through hole 119$a$ in other embodiment. The first chip 110 also includes a chip body 111, and the chip body 111 has the functional section P12 and a non-functional section P11, where the difference between the non-functional sections P11 and P10 is only the presence or absence of the through hole 119$a$, and there also may be no circuitry in the non-functional section P11.

The drilling process can be Through Silicon Via (TSV) process. For example, the through hole 119$a$ can be formed by laser drilling or etching. Next, an electroplating process is performed to the first chip 110, so as to form the conductive pillars 114 respectively in the through holes 119$a$, in which the conductive pillars 114 passes through the first chip 110. In addition, the electroplating process is used for not only forming the conductive pillars 114, but also forming at least one circuit pad 113 (FIG. 1B showing a plurality of circuit pads 113), in which both the circuit pads 113 and 112 are located on the same surface of the chip body 111, and the circuit pads 113 are connected to the conductive pillars 114.

It is necessary to note that the drilling process forms not only the through holes 119$a$, but also at least one first through hole 119$b$ in the non-functional section P11. Hence, the first chip 110 has not only the through hole 119$a$, but also the first through hole 119$b$, where both the first through holes 119$b$ and the through holes 119$a$ may run in the same direction. In addition, the embodiment as shown in FIG. 1B is illustrated with a plurality of first through holes 119$b$, for example. However, in other embodiment, the first chip 110 can also have only one first through hole 119$b$. Hence, FIG. 1B does not limit the quantity of the first through hole 119$b$ which the first chip 110 has.

Since there is no circuitry in the non-functional section P11, the first through holes 119$b$ and the through holes 119$a$ both do not affect the overall circuit function of the circuit pads 112, and both the conductive pillars 114 and the circuit pads 113 in the non-functional section P11 may not be electrically connected to circuit pads 112 directly. In other words, when the first chip 110 is not mounted on the wiring board 130, both the conductive pillars 114 and the circuit pads 113 can be electrically insulated from the circuit pads 112.

Referring to FIG. 1C, a second chip 120$i$ is provided. The second chip 120$i$ includes a chip body 121$i$ and a plurality of circuit pads 122. The circuit pads 122 are located on one of the surfaces of the chip body 121$i$. Taking FIG. 1C for example, the circuit pads 122 are all located on the lower surface of the chip body 121$i$. The chip body 121$i$ also has a non-functional section P20 and a functional section P22, where the functional section P22 is adjacent to the non-functional section P20. There is the circuitry of the second chip 120 in the functional section P22, but there is no circuitry in the non-functional section P20.

The second chip 120$i$ also may be a die, that is an unpackaged chip. Hence, the main material of the chip body 121$i$ can be semiconductor material, such as silicon or gallium arsenide (GaAs). However, in other embodiment, the second chip 120$i$ may be a packaged chip, so that the second chip 120$i$ is not limited to a die that is unpackaged. In addition, comparing FIGS. 1A and 1C, it can be known that the size of the first chip 110$i$ is distinctly larger than the size of the second chip 120$i$.

Referring to FIG. 1D, next, a drilling process is performed to the non-functional section P20 of the second chip 120$i$, so as to form a second chip 120 having at least one second through hole 129$b$. Specifically, the second chip 120 further has a first surface S21 and a second surface S22 opposite to the first surface S21, in which the second through hole 129$b$ extends from the second surface S22 to the first surface S21. Accordingly, both ends of the second through hole 129$b$ are exposed on the first surface S21 and the second surface S22 respectively. In addition, since the size of the first chip 110$i$ is larger than the size of the second chip 120$i$, the size of the first chip 110 is also larger than the size of the second chip 120.

FIG. 1D is illustrated with a plurality of second through holes 129b, for example. However, FIG. 1D does not limit the quantity of the second through hole 129b. The method of forming the second through hole 129b can be the same as the method of forming the first through hole 119b, so that the drilling process performed to the non-functional section P20 can be the TSV process. Moreover, the second chip 120 also includes a chip body 121, in which the chip body 121 has a functional section P22 and a non-functional section P21. The difference between the non-functional sections P21 and P20 is only the presence or absence of the second through hole 129b, in which the second through hole 129b is in the non-functional section P21, and there is no circuitry in the non-functional section P21.

Referring to FIGS. 1E and 1F, next, both the first chip 110 and the second chip 120 are mounted on the wiring board 130. The wiring board 130 includes a main part 131 and a plurality of circuit pads 132a, in which the main part 131 has a mounting surface 131a and a back surface 131b opposite to the mounting surface 131a, and the circuit pads 132a are located on the mounting surface 131a. The first chip 110 and the second chip 120 are all mounted on the mounting surface 131a, and the first chip 110 is electrically connected to at least one of the circuit pads 132a.

In the embodiment as shown in FIGS. 1E and 1F, after the first chip 110 is mounted on the wiring board 130, the second chip 120 is mounted on the first chip 110, so that the second chip 120 is stacked on the first chip 110. Both the first chip 110 and the second chip 120 can be mounted on the wiring board 130 by using flip-chip. Specifically, the first chip 110 can be mounted on the mounting surface 131a of the wiring board 130 by a plurality of solder balls B1, where the circuit pads 112 and 113 of the first chip 110 are electrically connected to the circuit pads 132a respectively by the solder balls B1, so that the first chip 110 can be electrically connected to at least one of the circuit pads 132a.

Referring to FIG. 1F, the second chip 120 can be mounted on the first chip 110. For example, the second chip 120 can be mounted on the first chip 110 by a plurality of solder balls B2, in which the circuit pads 122 of the second chip 120 are electrically connected to the conductive pillars 114 respectively by the solder balls B2. The conductive pillars 114 are connected to the circuit pads 113 respectively, and the circuit pads 113 are electrically connected to circuit pads 132a respectively by the solder balls B1, so that the conductive pillars 114 can be electrically connected to the circuit pads 132a and the second chip 120 respectively. Accordingly, the circuit pads 122 of the second chip 120 can be electrically connected to the wiring board 130 by the solder balls B1, B2, the conductive pillars 114, and the circuit pads 113, as shown in FIG. 1F.

Since the conductive pillars 114 and the circuit pads 113 are all located in the non-functional section P11 of the first chip 110 (referring to FIG. 1B), the second chip 120 can not be electrically connected to the first chip 110 through the solder balls B1, B2, the conductive pillars 114 and the circuit pads 113. In other words, the electric signal generated by the second chip 120 can not be transferred directly to the first chip 110 through the conductive pillars 114. The electric signal needs the wiring board 130 to be transferred to the first chip 110.

After both the first chip 110 and the second chip 120 are mounted on the wiring board 130, the first chip 110 is located between the second chip 120 and the wiring board 130, and the first surface S21 is between the second surface S22 and the first chip 110, in which the conductive pillars 114 are located between the second chip 120 and the wiring board 130. A gap is formed between adjacent two of the first chip 110, the second chip 120, and the wiring board 130. Taking FIG. 1F for example, a first gap G1 can be formed between the first chip 110 and the wiring board 130, and a second gap G2 can be formed between the first chip 110 and the second chip 120. Moreover, since the size of the first chip 110 is larger than the size of the second chip 120, the first chip 110 can protrude from a sidewall 129s of the second chip 120.

The wiring board 130 may be a printed wiring board or a package carrier, and the main part 131 is an element of the wiring board 130 other than the circuit pads 132a. In the embodiment, the main part 131 can include a plurality of circuit pads 132b, a plurality of insulation layers 138, a plurality of circuit layers 139, and a plurality of conductive connective members 136 and 137. The circuit pads 132b is opposite to the circuit pads 132a, and the circuit pads 132b is located on the back surface 131b. The insulation layers 138 and the circuit layers 139 are arrange alternately in a stack, where each of the circuit layers 139 can be sandwiched between adjacent two insulation layers 138.

The conductive connective members 136 and 137 are located in the insulation layers 138, and electrically connected to the circuit layers 139, the circuit pads 132a and 132b, so that the electric signals transmitted in the circuit layers 139 can be transferred among the circuit layers 139, the circuit pads 132a and 132b through the conductive connective members 136 and 137. In addition, in the embodiment, the conductive connective member 136 can be a conductive blind via structure, whereas the conductive connective member 137 can be a conductive buried via structure, as shown in FIGS. 1E and 1F.

In the embodiment, the wiring board 130 is a multilayer wiring board and has four circuit layers, that is two circuit layers 139 and the circuit pads 132a and 132b respectively located on two opposite sides of the wiring board 130. However, in other embodiment, the wiring board 130 may also be a single layer wiring board or a double-sided wiring board. Alternatively, the quantity of the circuit layers which the wiring board 130 has can be more than four, so that the quantity of the circuit layers which the wiring board 130 is not limited by FIGS. 1E and 1F.

It is worth noting that in the embodiment as shown in FIGS. 1E and 1F, the first chip 110 and the second chip 120 are mounted on the wiring board 130 by flip-chip. However, in other embodiment, the first chip 110 and the second chip 120 can be mounted on the wiring board 130 by other ways, such as wire bonding. Moreover, the second chip 120 also can be electrically connected to the wiring board 130 directly by using wire bonding without the conductive pillar 114. In other words, when the second chip 120 is electrically connected to the wiring board 130 by wire bonding, the conductive pillars 114 shown in FIG. 1F can be omitted. Hence, the way of mounting the first chip 110 and the second chip 120 on the wiring board 130 shown in FIG. 1F is for illustration only and not limited to only flip-chip.

Particularly, in the embodiment, the wiring board 130 may further include two insulation protective layers 133a and 133b, in which the insulation protective layer 133a can cover the mounting surface 131a and expose the circuit pads 132a. The insulation protective layer 133b is disposed on the main part 131 and opposite to the insulation protective layer 133a, where the main part 131 can be located between the insulation protective layers 133a and 133b. The insulation protective layer 133b can be located on the back surface 131b and exposes the circuit pads 132b. In addition, the insulation protective layers 133a and 133b may be solder masks.

It is worth noting that the wiring board 130 can further include a metal layer 134, in which the metal layer 134 is located on the mounting surface 131a and exposed by the insulation protective layer 133a. The metal layer 134 is not electrically connected to the circuit pads 132a and 132b. That is to say, the metal layer 134 can be electrically insulated from the circuit pads 132a and 132b, in which the metal layer 134 can be used as a grounding pad of the wiring board 130. In addition, the metal layer 134 and the circuit pads 132a can be made of the same metal layer which is treated by photolithography (including etching).

Referring to FIG. 1G, next, a thermally conductive material 140 fills the first through holes 119b and the second through holes 129b. After the thermally conductive material 140 fills the first through holes 119b and the second through holes 129b, the thermally conductive material 140 is located on the wiring board 130 and passes through the second chip 120 and the first chip 110, where the thermally conductive material 140 passing through the second chip 120 and the first chip 110 in sequence from the second surface S22 of the second chip 120 extends to the wiring board 130.

The thermally conductive material 140 can be an electric insulator, and the thermally conductive material 140 can contain a material with high thermal conductivity, such as graphene or other polymer material with high thermal conductivity, so that the thermally conductive material 140 is electrically insulated from the conductive pillar 114. In other words, although the thermally conductive material 140 directly touches the solder balls B1, B2 and the circuit pads 113, the thermally conductive material 140 is still not electrically connected to the conductive pillars 114, so as to prevent the conductive pillars 114 from short circuit.

Before the thermally conductive material 140 fills the first through holes 119b and the second through holes 129b, an assisting tool 10 can be disposed on the wiring board 130. The assisting tool 10 can cover and fix both the first chip 110 and the second chip 120, so as to prevent the first chip 110 and the second chip 120 moving move relatively. Hence, in the subsequent process, the assisting tool 10 can help the thermally conductive material 140 fill the first through holes 119b and the second through holes 129b successfully.

The assisting tool 10 has a top cover 17, a first wall 18, a second wall 19, and an opening 11, in which both the first wall 18 and the second wall 19 are ring shaped. The top cover 17 is connected to the second wall 19 and located on the second wall 19 and the first wall 18. The opening 11 is formed in the top cover 17, and the second wall 19 is above the first wall 18. After the assisting tool 10 covers and fixes both the first chip 110 and the second chip 120, the top cover 17 covers the second chip 120, while both the first wall 18 and the second wall 19 surround the first chip 110 and the second chip 120 respectively, in which the opening 11 exposes the second through holes 129b. Hence, the thermally conductive material 140 can fill both the first through holes 119b and the second through holes 129b from the opening 11.

When the thermally conductive material 140 fills the first through holes 119b and the second through holes 129b from the opening 11, the thermally conductive material 140 is fluid at this time, so that the thermally conductive material 140 can flow into the second gap G2, the first through holes 119b, and the first gap G1 in sequence from the second through holes 129b, so as to make the thermally conductive material 140 fill the first through hole 119b, the second through hole 129b, the first gap G1, and the second gap G2.

Since the thermally conductive material 140 can fill the first gap G1, the thermally conductive material 140 can directly touch the metal layer 134. Moreover, in the embodiment as shown in FIG. 1G, the first wall 18 may touch the sidewall 119s of the first chip 110, whereas the second wall 19 may not touch the sidewall 129s of the second chip 120, so that the fluid thermally conductive material 140 can touch the sidewall 129s and fill the gap between the sidewall 129s and the second wall 19. After the thermally conductive material 140 fills the first through holes 119b and the second through holes 129b, the assisting tool 10 is removed. Before removing the assisting tool 10, the thermally conductive material 140 can be cured by heating.

Referring to FIGS. 1H and 1I, after the thermally conductive material 140 fills the first through holes 119b and the second through holes 129b, a molding compound 150 is formed on the wiring board 130 (as shown in FIG. 1I). In the embodiment, forming the molding compound 150 can include the following steps.

Referring to FIG. 1H, first, an initial molding compound 150i is formed on the wiring board 130, in which the initial molding compound 150i covering the first chip 110, the second chip 120, the wiring board 130, and the thermally conductive material 140 can wrap the first chip 110, the second chip 120, and the thermally conductive material 140. In addition, in the embodiment as shown in FIG. 1H, the initial molding compound 150i completely covers the second surface S22 of the second chip 120 and the second through holes 129b, so that the first chip 110, the second chip 120, and the thermally conductive material 140 are completely encapsulated in the initial molding compound 150i.

Referring to FIGS. 1H and 1I, next, a part of the initial molding compound 150i above the second chip 120 is removed, so as to expose the thermally conductive material 140 and to form a molding compound 150, in which the molding compound 150 deposed on the mounting surface 131a covers the first chip 110 and the wiring board 130, and surrounds the second chip 120. Additionally, In the embodiment, the molding compound 150 does not touch the sidewall 129s of the second chip 120, and part of the thermally conductive material 140 can fill the gap between the sidewall 129s and the molding compound 150, as shown in FIG. 1I.

In the embodiment, removing the part of the initial molding compound 150i may be grinding the initial molding compound 150i. Hence, the part of the initial molding compound 150i above the second chip 120 can be removed, so as to expose the thermally conductive material 140 and the second chip 120. After grinding the initial molding compound 150i, the thermally conductive material 140 has a top surface 141, whereas the molding compound 150 has an upper surface 151, in which the top surface 141, the second surface S22, and the upper surface 151 can be flush with each other.

Referring to FIG. 1J, afterwards, a heat dissipation part 160 is formed on the upper surface 151 of the molding compound 150, in which the molding compound 150 is located between the heat dissipation part 160 and the wiring board 130, and the heat dissipation part 160 may be a thermal glue, a thermal pad, or a heat sink. The heat dissipation part 160 is thermally coupled to the thermally conductive material 140. Specifically, the heat dissipation part 160 disposed on the molding compound 150 can directly touch the thermally conductive material 140 and the second surface S22 of the second chip 120. Alternatively, a thermally conductive material with high thermal conductivity (not shown), such as thermal paste or thermal glue, can be disposed between the heat dissipation part 160 and the thermally conductive material 140. After the heat dissipation part 160 is formed, a chip package structure 100 including the wiring board 130, the first chip 110, the second chip 120, the thermally conductive material 140, the molding compound 150, and the heat dissipation part 160 is basically complete.

Based on the above, the heat generated by the second chip 120 can be transferred to the heat dissipation part 160, and the heat generated by the first chip 110 can be transferred from the thermally conductive material 140 to the heat dissipation part 160. Hence, the heat generated by both the first chip 110 and the second chip 120 can be quickly transferred to the heat dissipation part 160, so that the heat can be dissipated from the heat dissipation part 160 to avoid the heat accumulation that cause the first chip 110 and the second chip 120 to reduce efficacy. In addition, since the thermally conductive material 140 can directly touch the metal layer 134, the heat generated by both the first chip 110 and the second chip 120 also can be transferred to the metal layer 134, so as to help to reduce the heat accumulation.

Figure 2A:
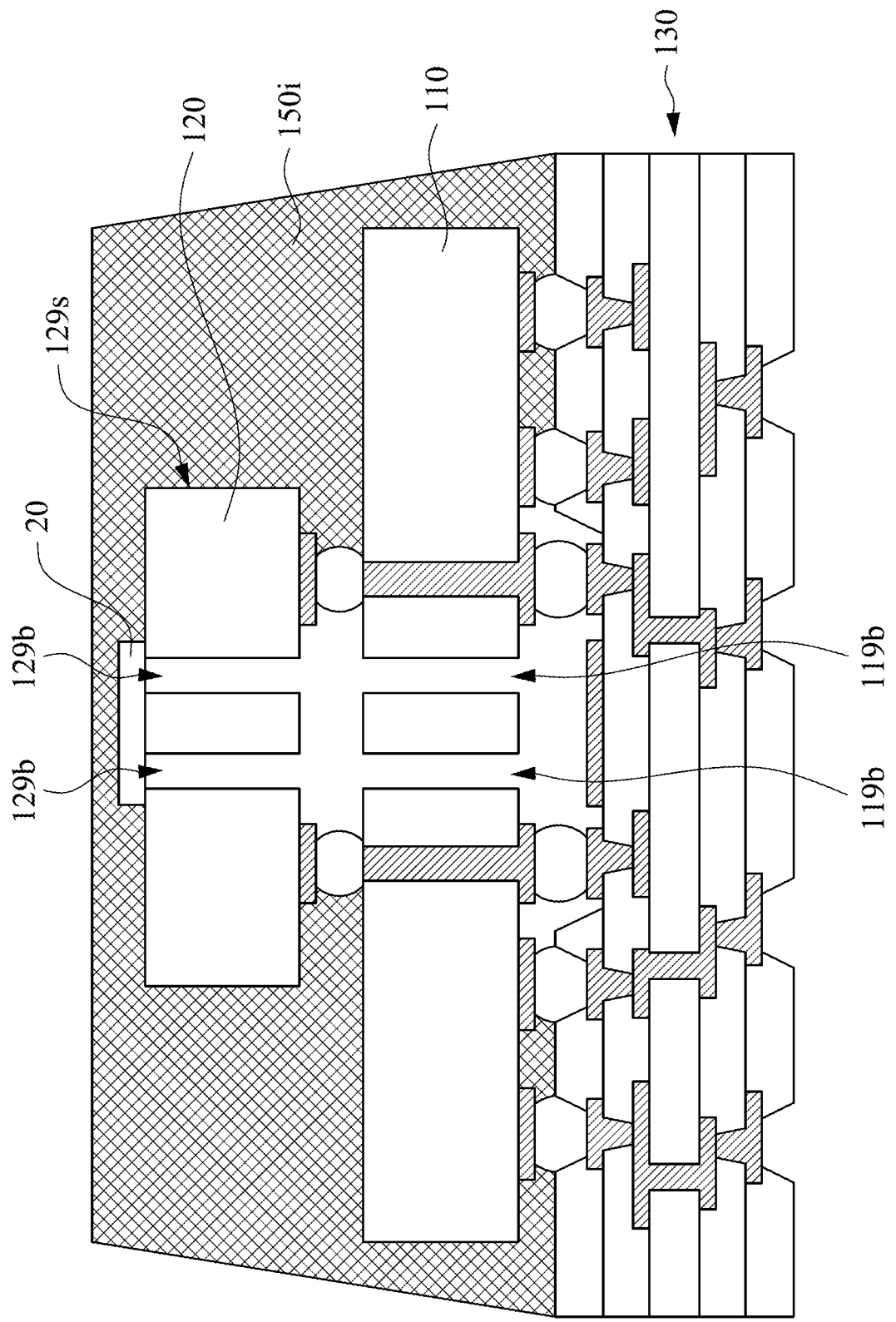
FIGS. 2A to 2C are schematic cross-sectional views of a method of manufacturing a chip package structure according to another embodiment of the disclosure.
Figure 2B:
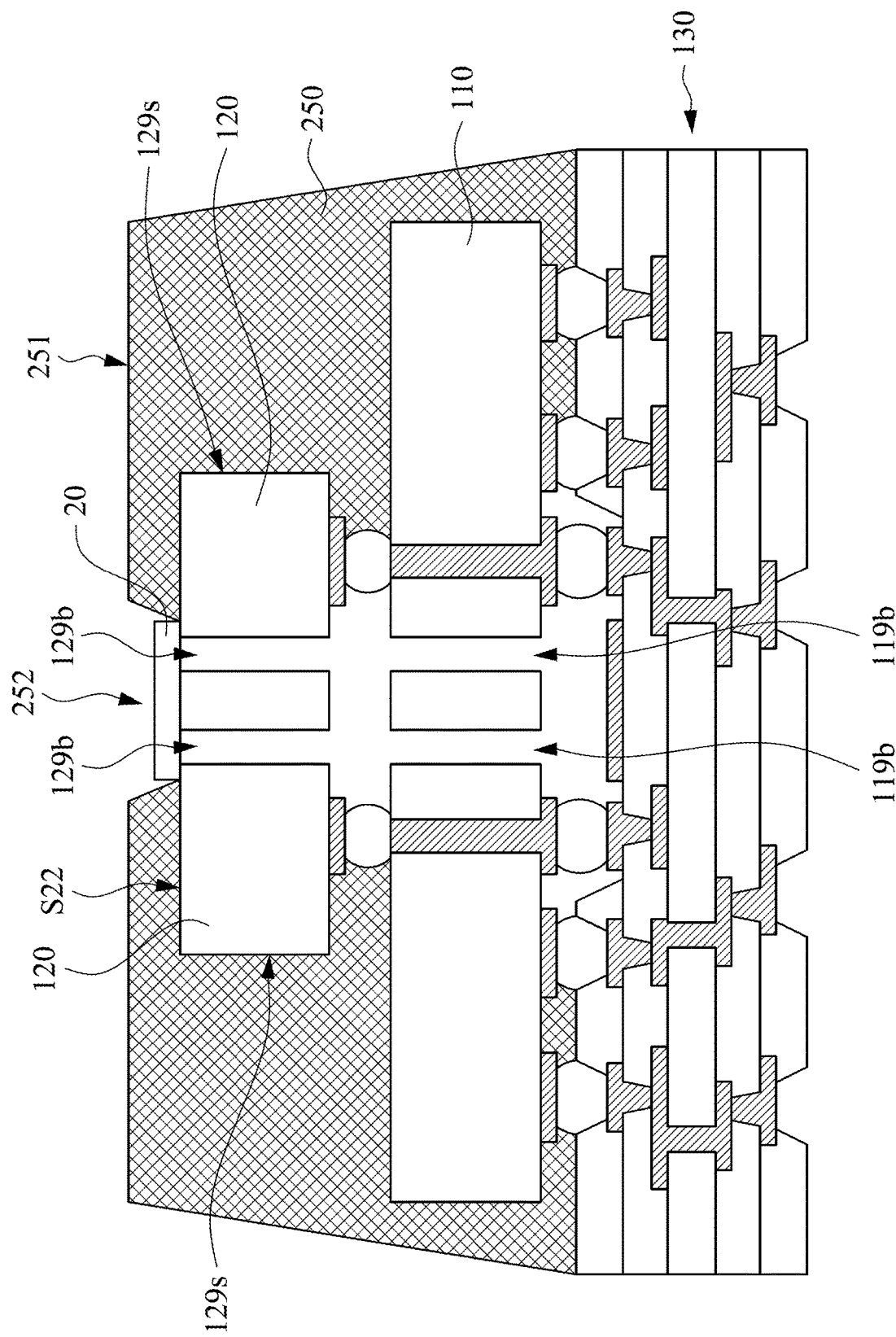
Figure 2C:
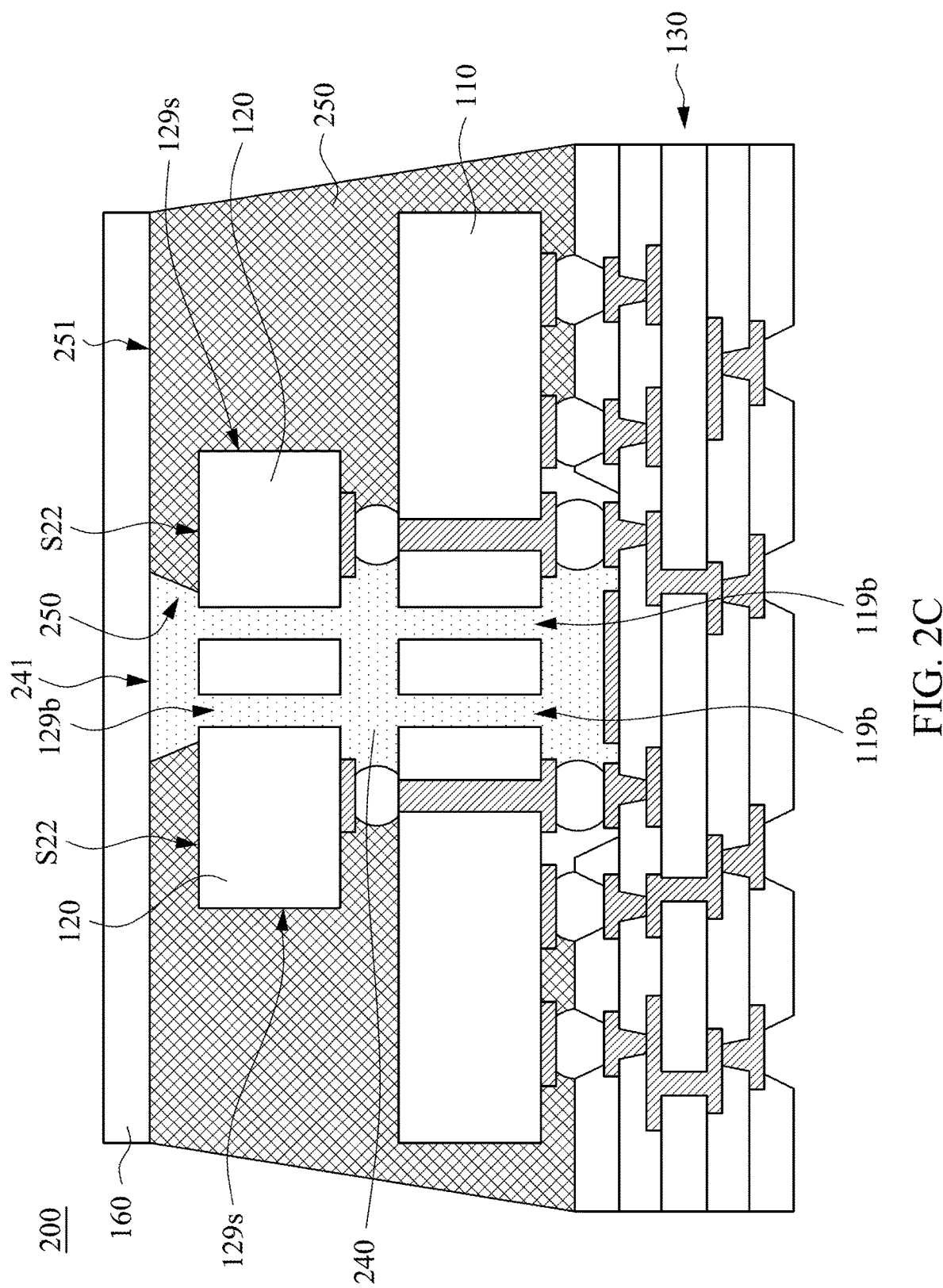

FIGS. 2A to 2C are schematic cross-sectional views of a method of manufacturing a chip package structure according to another embodiment of the disclosure. Referring to FIG. 2A, the method of manufacturing the chip package structure of the embodiment is similar to that of the previous embodiment. Hence, the following mainly describes the difference between the methods of fabricating the chip package structure of the present and previous embodiments respectively. The same features of the present and previous embodiments are not described in principle and not shown in the drawings.

The main difference between the present and previous embodiments is that in the previous embodiment (referring to FIGS. 1A to 1J), the thermally conductive material 140 fills the first through holes 119b and the second through holes 129b before the molding compound 150 is formed, but in the present embodiment, the thermally conductive material 240 fills the first through holes 119b and the second through holes 129b after the molding compound 150 is formed. In addition, the composition of the thermally conductive material 240 in this embodiment is the same as the composition of the thermally conductive material 140 in the previous embodiment.

Referring to FIG. 2A, after both the first chip 110 and the second chip 120 are mounted on the wiring board 130, a cover layer 20 is disposed on the second chip 120, in which the cover layer 20 completely covers all of the second through holes 129b of the second chip 120. The cover layer 20 may be a tape or a sticker and can adhere to the second chip 120, so as to block the subsequent initial molding compound 150i entering the second through holes 129b.

Next, the initial molding compound 150i is formed on the wiring board 130, in which the initial molding compound 150i covers the first chip 110, the second chip 120, the wiring board 130, and the cover layer 20. Since the cover layer 20 completely covers all of the second through holes 129b, the initial molding compound 150i basically can not enter the second through holes 129b and the first through holes 119b.

Referring to FIGS. 2A and 2B, next, the part of the initial molding compound 150i above the second chip 120 is removed, so as to expose the cover layer 20 and to form a molding compound 250 having an opening 252, in which the opening 252 exposes the cover layer 20. Removing the part of the initial molding compound 150i may be photolithography or laser drilling. When the part of the initial molding compound 150i is removed by photolithography or laser drilling to form the molding compound 250, the upper surface 251 of the molding compound 250 is not flush with the second surface S22 of the second chip 120, where the level of the upper surface 251 relative to the wiring board 130 can be higher than the level of the second surface S22 relative to the wiring board 130, as shown in FIG. 2B. Moreover, in the embodiment, the initial molding compound 150i can cover and directly touch the sidewall 129s of the second chip 120 to wrap the second chip 120.

Referring to FIGS. 2B and 2C, after the part of the initial molding compound 150i above the second chip 120 is removed, the cover layer 20 is removed, so as to expose the second through holes 129b. Since the cover layer 20 may be a tape or a sticker, the cover layer 20 can be peeled for removal. Referring to FIG. 2C, after removing the cover layer 20, the thermally conductive material 240 fills the first through holes 119b and the second through holes 129b, so that the thermally conductive material 240 on the wiring board 130 passes through both the second chip 120 and the first chip 110. In addition, since the composition of the thermally conductive material 240 may be the same as the composition of the thermally conductive material 140, the thermally conductive material 240 in the first through holes 119b and the second through holes 129b can be cured, where the way of curing the thermally conductive material 240 can be heating.

Afterwards, the heat dissipation part 160 is formed on the upper surface 251 of the molding compound 250, where the molding compound 250 is located between the heat dissipation part 160 and the wiring board 130, and the heat dissipation part 160 is thermally coupled to the thermally conductive material 240. At this time, a chip package structure 200 is basically complete. Since the upper surface 251 of the molding compound 250 is not flush with the second surface S22 of the second chip 120, the top surface 241 of the thermally conductive material 240 can be flush with the upper surface 251, not the second surface S22, as shown in FIG. 2C.

Figure 3A:
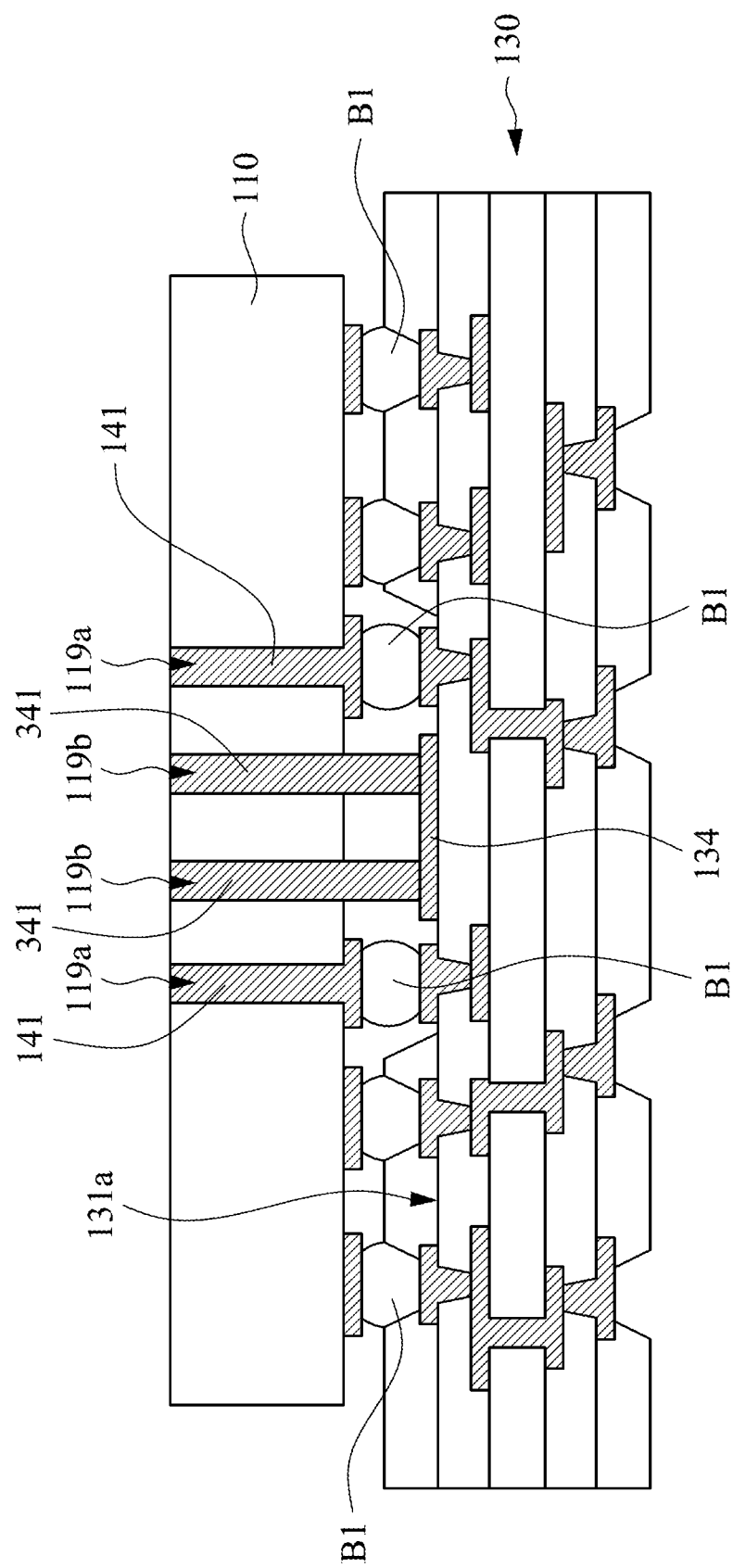
FIGS. 3A to 3C are schematic cross-sectional views of a method of manufacturing a chip package structure according to another embodiment of the disclosure.
Figure 3B:
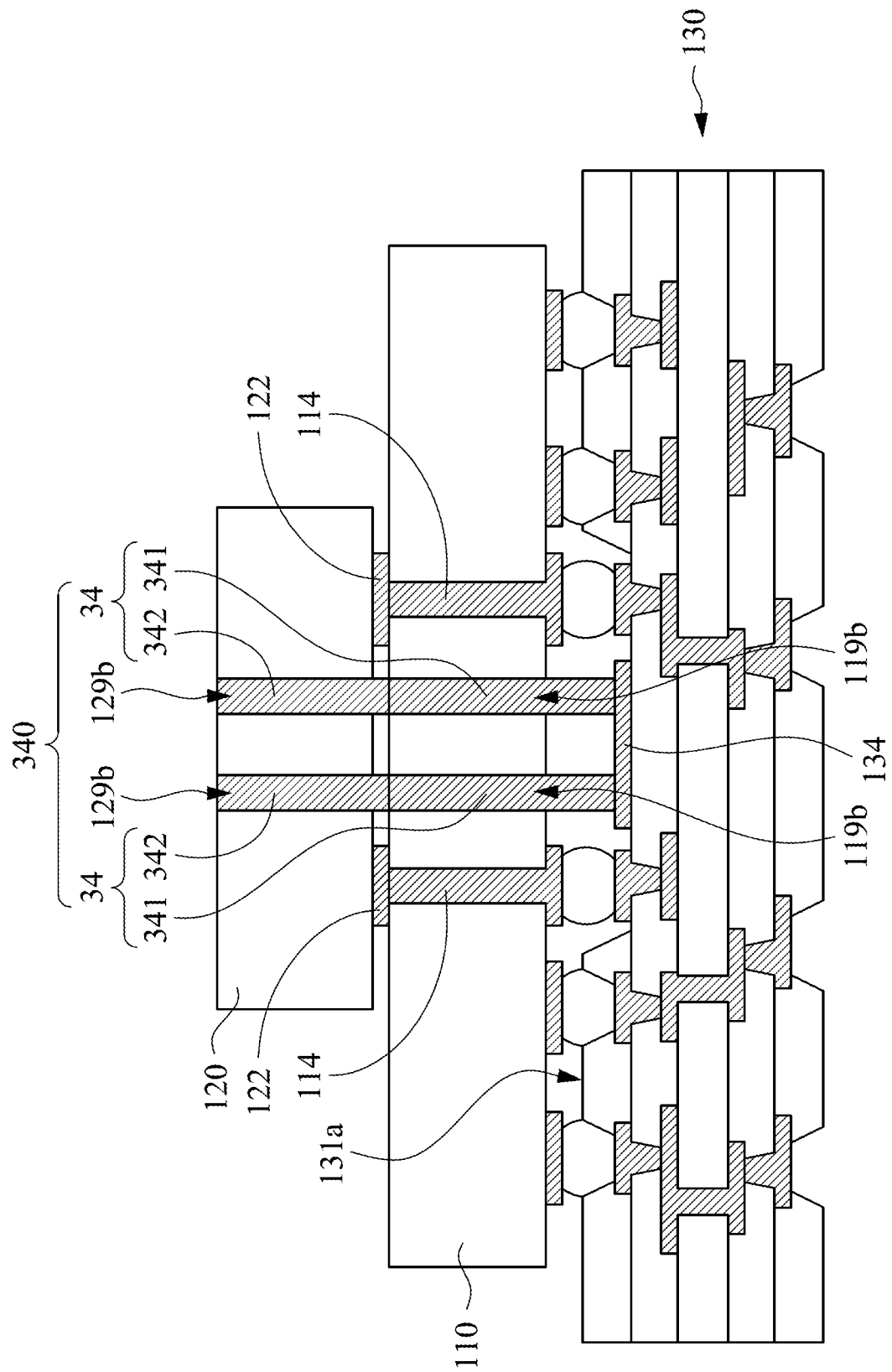
Figure 3C:
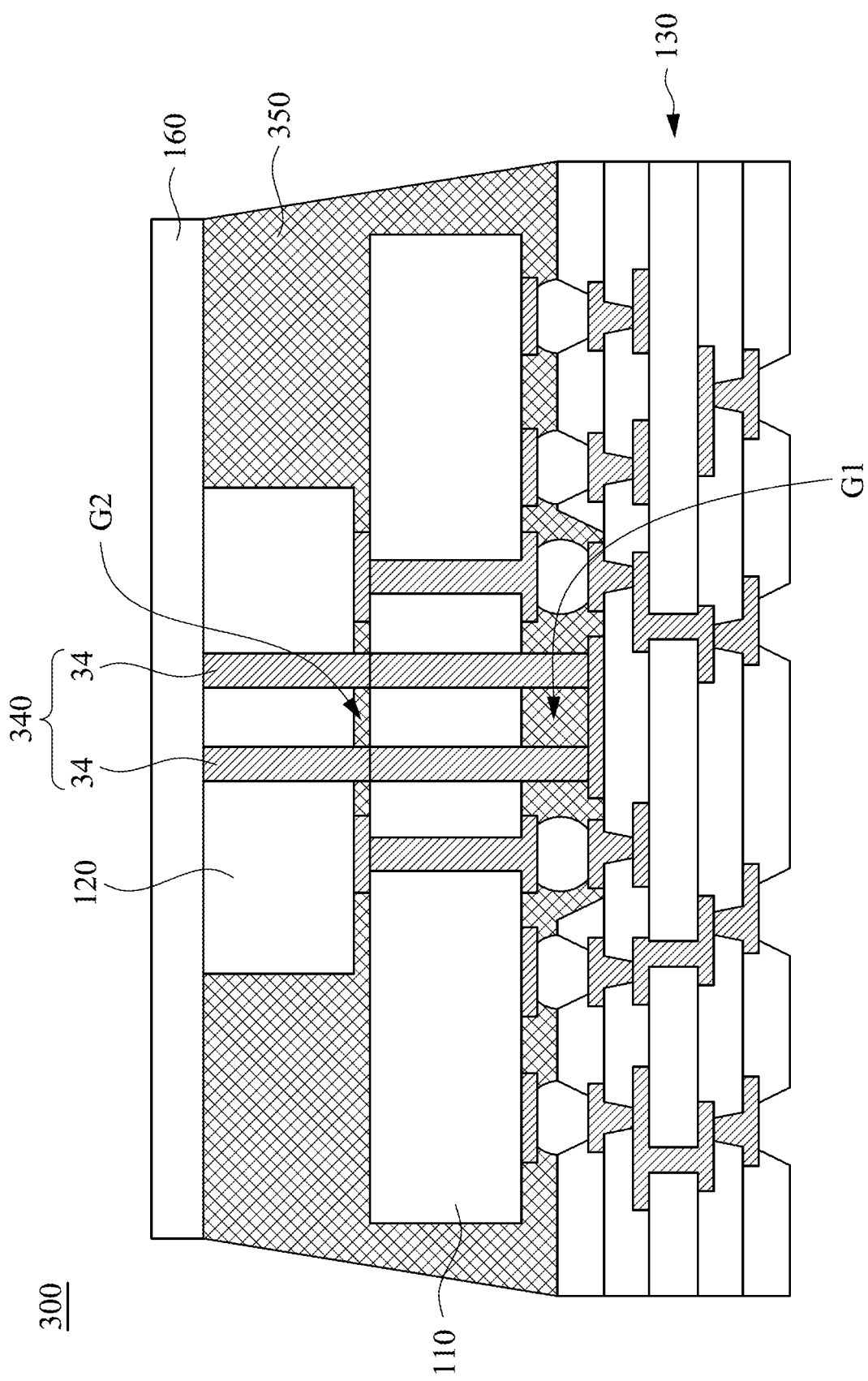

FIGS. 3A to 3C are schematic cross-sectional views of a method of manufacturing a chip package structure according to another embodiment of the disclosure. The method of manufacturing the chip package structure of this embodiment is similar to that of the previous embodiment, and the main difference between this embodiment and the previous embodiment is that the thermally conductive material 340 of this embodiment (referring to FIG. 3B) fills the first through hole 119b and the second through hole 129b before both the first chip 110 and the second chip 120 are mounted on the wiring board 130.

Referring to FIG. 3A, first, a first chip 110 having at least one first through hole 119b and at least one first through hole 119a is provided. Next, a process of plating through hole is performed to the first through holes 119b and the through holes 119a, so as to form a plurality of first metal sub-pillars 341 in the first through holes 119b and a plurality of conductive pillars 114 in the through holes 119a. Afterwards, the first chip 110 is mounted on the mounting surface 131a of the wiring board 130.

After the first chip 110 is mounted on the wiring board 130, the first metal sub-pillars 341 can be thermally coupled to the metal layer 134 of the wiring board 130. For example, the first metal sub-pillars 341 directly touch the metal layer 134. Alternatively, a thermally conductive material with high thermal conductivity (not shown), such as thermal paste, thermal glue, or tin solder, is disposed between the first metal sub-pillars 341 and the metal layer 134.

Referring to FIG. 3B, a second chip 120 having at least one second through hole 129b is provided. Next, a process of plating through hole is performed to the second through holes 129b, so as to form a plurality of second metal sub-pillars 342 in the second through holes 129b. Afterwards, the second chip 120 is mounted on the first chip 110, in which the second metal sub-pillars 342 align to the first metal sub-pillars 341 respectively, and the second chip 120 can be mounted on the first chip 110 by ultrasonic bonding, so that the second metal sub-pillars 342 are connected to the first metal sub-pillars 341 respectively. In addition, in the process of mounting the second chip 120 on the first chip 110, the circuit pads 122 of the second chip 120 also can be electrically connected to the conductive pillars 114 respectively by ultrasonic bonding, so that the second chip 120 can be electrically connected to the wiring board 130 through the conductive pillar 114s.

Particularly, in this embodiment, the second chip 120 is mounted on the first chip 110 by ultrasonic bonding. However, in other embodiment, the second chip 120 can be mounted on the first chip 110 by using a plurality of solder balls B2 (referring to FIG. 1F), in which the solder balls B2 can be connected to the circuit pads 122, the conductive pillars 114, the first metal sub-pillars 341, and the second metal sub-pillars 342, so that the circuit pads 122 are electrically connected to conductive pillars 114, and the first metal sub-pillars 341 are connected to the second metal sub-pillars 342.

After both the first chip 110 and the second chip 120 are mounted on the wiring board 130, the first metal sub-pillar 341 and the second metal sub-pillar 342 connected to each other form a metal pillar 34, and the thermally conductive material 340 includes at least one metal pillar 34. Moreover, the present embodiment takes the thermally conductive material 340 including a plurality of metal pillars 34 for example, whereas in other embodiment, the thermally conductive material 340 also may include only one metal pillar 34. Hence, FIG. 3B does not limit the quantity of the metal pillar 34 included by the thermally conductive material 340. This embodiment is an example of a thermally conductive material 340 comprising multiple metal pillars 34, while in other embodiments, the thermally conductive material 340 may also comprise only one metal pillar 34. Therefore, FIG. 3B does not limit the number of metal pillars 34 included in the thermal conductive material 340.

The metal pillars 34 pass through the first chip 110 and the second chip 120 from the first through holes 119b and the second through holes 129b. The first through holes 119b are in the non-functional section P11, whereas the second through holes 129b are in the non-functional section P21, so that the first chip 110, the second chip 120, and the circuit pads 132a of the wiring board 130 are all electrically insulated from the thermally conductive material 340. Moreover, since the first metal sub-pillars 341 are thermally coupled to the metal layer 134 of the wiring board 130, so that the metal pillars 34 also can be thermally coupled to the metal layer 134 of the wiring board 130.

Referring to FIG. 3C, afterwards, a molding compound 350 and the heat dissipation part 160 are formed in sequence, where the molding compound 350 can fill the first gap G1 between the first chip 110 and the wiring board 130 and the second gap G2 between the first chip 110 and the second chip 120. At this time, a chip package structure 300 including the molding compound 350 and the thermally conductive material 340 is basically complete. In addition, the material and forming method of the molding compound 350 can be similar to or the same as the material and forming method of the molding compound 150 as shown in FIGS. 1H and 1I, and thus, it is not described herein.

It is necessary to note that all of the abovementioned embodiments are based on two chips, i.e., the first chip 110 and the second chip 120, for example. However, in other embodiment, the chip package structure can include three or more than three chips, so that the quantity of the chips included by the chip package structure according to the abovementioned embodiments is not limited to two.

Consequently, since the thermally conductive material can pass through a plurality of chips (e.g., the second chip and the first chip), the thermally conductive material can transfer the heat generated by the chips to the heat dissipation part, so that the heat from the chips can be transferred to the heat dissipation part quickly, so as to help dissipate the heat for the chips, thereby improving the efficacy of the chips.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A chip package structure, comprising:
   a wiring board, comprising a main part and a plurality of circuit pads, wherein the main part has a mounting surface, and the circuit pads are located on the mounting surface;
   a first chip, mounted on the mounting surface and electrically connected to at least one of the circuit pads;
   a second chip, stacked on the first chip, wherein the first chip is located between the second chip and the wiring board, and the second chip has a first surface and a second surface opposite to the first surface;
   a thermally conductive material, located on the wiring board and passing through both the second chip and the first chip, wherein the thermally conductive material passing through a non-functional section of the second chip and a non-functional section of the first chip in sequence from the second surface of the second chip extends to the wiring board, and the first chip, the second chip and the circuit pads are all electrically insulated from the thermally conductive material;
   a molding compound, disposed on the mounting surface and covering the first chip and the mounting surface, wherein the molding compound surrounds the second chip; and
   a heat dissipation part, disposed on the molding compound and thermal coupled to the thermally conductive material, wherein the molding compound is located between the heat dissipation part and the wiring board.

2. The chip package structure of claim 1, wherein the heat dissipation part directly touches the thermally conductive material and the second surface of the second chip.

3. The chip package structure of claim 1, wherein the first chip has at least one first through hole, and the second chip has at least one second through hole, wherein the thermally conductive material is an electric insulator and fills the at least one first through hole, the at least one second through hole, a first gap and a second gap, wherein the first gap is located between the first chip and the wiring board, whereas the second gap is located between the first chip and the second chip.

4. The chip package structure of claim 1, wherein the first chip has at least one first through hole, and the second chip has at least one second through hole,
wherein the thermally conductive material comprises at least one metal pillar, and the at least one metal pillar passes through the first chip and the second chip from the first through hole and the second through hole,
wherein the first chip, the second chip, and the circuit pads are all electrically insulated from the thermally conductive material.

5. The chip package structure of claim 1, further comprising:
at least one conductive pillar, passing through the first chip and located between the second chip and the wiring board, wherein the at least one conductive pillar is electrically connected to the second chip and at least one of the circuit pads, and the thermally conductive material is electrically insulated from the at least one conductive pillar.

6. The chip package structure of claim 1, wherein a size of the first chip is larger than a size of the second chip.

7. The chip package structure of claim 1, wherein the thermally conductive material has a top surface, and the molding compound has an upper surface,
wherein the top surface, the second surface, and the upper surface are flush with each other.

8. A method of manufacturing chip package structure, comprising:
mounting a first chip and a second chip on a wiring board, wherein the first chip is located between the second chip and the wiring board, a non-functional section of the first chip has at least one first through hole, and a non-functional section of the second chip has at least one second through hole;
filling both the at least one first through hole and the at least one second through hole with a thermally conductive material, so that the thermally conductive material passes through the non-functional section of the first chip and the non-functional section of the second chip from the at least one first through hole and the at least one second through hole, wherein the first chip, the second chip and the circuit pads are all electrically insulated from the thermally conductive material;
forming a molding compound on the wiring board, wherein the molding compound covers the first chip and the wiring board, and surrounds the second chip; and
forming a heat dissipation part on the molding compound, wherein the heat dissipation part is thermally couple to the thermally conductive material.

9. The method of claim 8, wherein the thermally conductive material fills both the at least one first through hole and the at least one second through hole before forming the molding compound.

10. The method of claim 9, further comprising:
disposing an assisting tool on the wiring board before the thermally conductive material fills the at least one first through hole and the at least one second through hole, wherein the assisting tool having an opening exposing the at least one second through hole covers and fixes the first chip and the second chip, and the thermally conductive material fills both the at least one first through hole and the at least one second through hole from the opening; and
removing the assisting tool after the thermally conductive material fills both the at least one first through hole and the at least one second through hole and before forming the molding compound.

11. The method of claim 9, wherein the step of forming the molding compound on the wiring board comprises:
forming an initial molding compound on the wiring board, wherein the initial molding compound covers the first chip, the second chip, the wiring board, and the thermally conductive material; and
removing a part of the initial molding compound above the second chip, so as to expose the thermally conductive material.

12. The method of claim 11, wherein removing the part of the initial molding compound above the second chip comprises:
grinding the initial molding compound, so as to expose the thermally conductive material and the second chip.

13. The method of claim 8, wherein the thermally conductive material fills the at least one first through hole and the at least one second through hole after forming the molding compound.

14. The method of claim 13, further comprising:
before the thermally conductive material fills the at least one first through hole and the at least one second through hole, disposing a cover layer on the second chip, wherein the cover layer completely covers the at least one second through hole;
forming an initial molding compound on the wiring board, wherein the initial molding compound covers the first chip, the second chip, the wiring board, and the cover layer;
removing a part of the initial molding compound above the second chip, so as to expose the cover layer; and
after removing the part of the initial molding compound above the second chip, removing the cover layer, so as to expose the at least one second through hole.

15. The method of claim 14, wherein removing the part of the initial molding compound above the second chip comprises photolithography or laser drilling.

16. The method of claim 8, wherein the thermally conductive material fills the at least one first through hole and the at least one second through hole before both the first chip and the second chip are mounted on the wiring board.

17. The method of claim 16, wherein filling both the at least one first through hole and the at least one second through hole with a thermally conductive material comprises:
performing a process of plating through hole to the at least one first through hole and the at least one second through hole, so as to from a first metal sub-pillar in the first through hole and a second metal sub-pillar in the second through hole.

18. The method of claim 17, wherein in a process of mounting the first chip and the second chip on the wiring board, the second metal sub-pillar aligns to the first metal sub-pillar, and the second metal sub-pillar is connected to the first metal sub-pillar.

19. The method of claim 8, further comprising:
before both the first chip and the second chip are mounted on the wiring board, forming at least one conductive pillar passing through the first chip.

* * * * *